United States Patent
Bocage

(10) Patent No.: US 10,274,540 B2
(45) Date of Patent: Apr. 30, 2019

(54) METHOD FOR IDENTIFYING THE EXISTENCE OF A FAILURE, METHOD FOR IDENTIFYING A FAILED RELAY DEVICE, METHOD FOR IDENTIFYING THE TYPE OF FAILURE AND ASSOCIATED POWER SUPPLY SYSTEM

(71) Applicant: SAFRAN ELECTRONICS & DEFENSE, Boulogne-Billancourt (FR)

(72) Inventor: Frédéric Bocage, Boulogne-Billancourt (FR)

(73) Assignee: SAGEM DEFENSE SECURITE, Boulogne-Billancourt (FR)

( * ) Notice: Subject to any disclaimer, the term of this patent is extended or adjusted under 35 U.S.C. 154(b) by 0 days.

(21) Appl. No.: 15/515,352

(22) PCT Filed: Sep. 29, 2015

(86) PCT No.: PCT/EP2015/072380
§ 371 (c)(1),
(2) Date: Mar. 29, 2017

(87) PCT Pub. No.: WO2016/050745
PCT Pub. Date: Apr. 7, 2016

(65) Prior Publication Data
US 2017/0219654 A1    Aug. 3, 2017

(30) Foreign Application Priority Data

Sep. 30, 2014 (FR) ...................... 14 59250

(51) Int. Cl.
*G01R 31/327* (2006.01)
*G01R 31/42* (2006.01)
*G01R 31/00* (2006.01)

(52) U.S. Cl.
CPC ....... *G01R 31/3275* (2013.01); *G01R 31/008* (2013.01); *G01R 31/42* (2013.01); *G01R 31/005* (2013.01)

(58) Field of Classification Search
CPC ... G01R 31/3275; G01R 31/008; G01R 31/42
See application file for complete search history.

(56) References Cited

U.S. PATENT DOCUMENTS 3,551,855 A * 12/1970 Seidel ........................ H01P 5/02
333/33
4,459,437 A * 7/1984 Gabry ................... H04M 3/301
324/520

(Continued)

FOREIGN PATENT DOCUMENTS

WO         00/39597 A1    7/2000

OTHER PUBLICATIONS

Kezunovic, M., et al., "Design, Implementation and Validation of a Real-Time Digital Simulator for Protection Relay Testing," IEEE Transactions on Power Delivery 11(1), pp. 158-164, Jan. 1, 1996.

(Continued)

*Primary Examiner* — Son T Le
*Assistant Examiner* — Akm Zakaria
(74) *Attorney, Agent, or Firm* — Christensen O'Connor Johnson Kindness PLLC

(57) ABSTRACT

A method for identifying the existence of a failure of a relay device in an electrical power supply system of a device to be supplied with power, the power supply system comprising at least one power generator configured to generate a power supply signal and a load comprising at least one relay device; the power generator comprising a frequency variator; each relay device comprising a quadripole and at least one antenna linked to the quadripole. The identification method comprises the following steps: a) selecting a char- (Continued)

Figure 1:
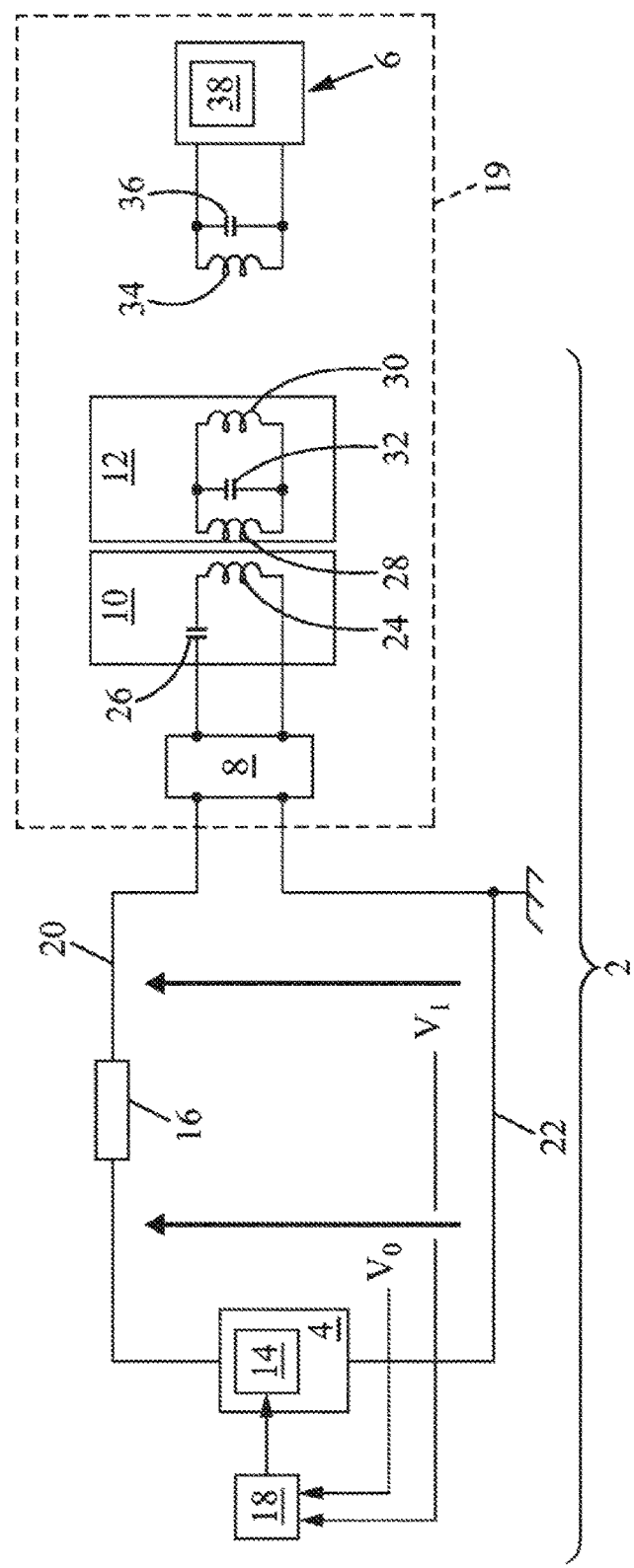

acteristic frequency, b) determining the impedance of the load, then when the supply signal has the selected characteristic frequency, c) repeating steps a) and b) for several distinct characteristic frequencies, d) identifying the existence of a failure from several impedances determined for different characteristic frequencies.

11 Claims, 7 Drawing Sheets

(56) References Cited

U.S. PATENT DOCUMENTS

| | | | | | |
|---|---|---|---|---|---|
| 6,035,265 | A | * | 3/2000 | Dister | G01R 31/343 324/765.01 |
| 2006/0212745 | A1 | * | 9/2006 | Zansky | G01R 31/3277 714/6.12 |
| 2008/0100145 | A1 | * | 5/2008 | Ito | H02J 3/38 307/125 |
| 2008/0157775 | A1 | * | 7/2008 | Finney | G01R 31/3277 324/418 |
| 2012/0112651 | A1 | | 5/2012 | King et al. | |
| 2012/0306265 | A1 | * | 12/2012 | Yamamoto | B60L 5/005 307/9.1 |
| 2013/0221973 | A1 | * | 8/2013 | Whisenand | G01R 31/1272 324/501 |
| 2013/0278072 | A1 | * | 10/2013 | Yoon | G01R 21/00 307/104 |
| 2014/0127993 | A1 | * | 5/2014 | Frankland | G06K 19/0726 455/41.1 |
| 2014/0152119 | A1 | * | 6/2014 | Endo | H02J 5/005 307/104 |
| 2015/0048883 | A1 | * | 2/2015 | Vinayak | H02M 3/06 330/127 |

OTHER PUBLICATIONS

Khanniche, M.S., and Lake, I.D.W., "Real Time Hysteresis Controller for Relay Testing," IEE Proceedings: Electric Power Applications, Institution of Electrical Engineers 141(2), pp. 71-76, Mar. 1, 1994.

International Search Report dated Jan. 5, 2016, issued in corresponding International Application No. PCT/EP2015/072380, filed Sep. 29, 2015, 3 pages.

Written Opinion of the International Searching Authority dated Jan. 5, 2016, issued in corresponding International Application No. PCT/EP2015/072380, filed Sep. 29 2015, 11 pages.

* cited by examiner

METHOD FOR IDENTIFYING THE EXISTENCE OF A FAILURE, METHOD FOR IDENTIFYING A FAILED RELAY DEVICE, METHOD FOR IDENTIFYING THE TYPE OF FAILURE AND ASSOCIATED POWER SUPPLY SYSTEM

The invention relates to a method for identifying a failed relay device in an electrical power supply system adapted to supply power to an apparatus by transmitting a power signal between a power generator, at least one relay device, and the apparatus to be supplied with power. This method makes it possible to identify whether a relay device has failed and the type of failure among a predefined number of typical failures. If the power supply system comprises a plurality of relay devices, the method according to the invention makes it possible to identify which relay device has failed.

Such a power supply system may, for example, be used to power a pressure sensor in a passenger transport vehicle such as an aircraft or train.

There are many methods for identifying the existence of a failure.

One known method for identifying the failed relay device consists of adding active elements to the various relay devices. These active elements perform a failure self-diagnosis and communicate this information to a processor.

The use of this method requires that ground personnel check regularly, for example at each stopover, that the batteries powering these active elements are charged so that they can be charged if necessary. This verification is costly and may increase the ground turnaround time of the aircraft. The use of this method also requires the installation of complex electronics (at least a power source and a processing circuit) which poses problems in terms of mechanical integration (limited space), reliability (reduced equipment availability due to the additional electronics), and the temperature resistance of the additional electronics.

Another known method of identifying the failed relay device consists of measuring the amplitude of the current and the amplitude of the voltage of the signal that is output from the processor to the apparatus to be supplied with power. The amplitude of the voltage is compared with a maximum voltage threshold and a minimum voltage threshold. Similarly, the amplitude of the current is compared with a maximum current threshold and a minimum current threshold. These comparisons are used to determine which relay device has failed.

This method also has limitations.

First of all, this method is highly sensitive to the characteristics of the cable used, particularly its length. However, because of manufacturing tolerances for the parts, the length of the cable may vary from one aircraft to another or between devices by an amount sufficient to cause detection of a non-existent failure or, conversely, in a more dangerous case, non-detection of the presence of a failure. In addition, if the aircraft manufacturer decides to change the diameter and/or length of the cable or to move the first relay device after the thresholds have been determined, these maximum and minimum thresholds are no longer correct and must be determined once again. Such determination requires numerous tests which may last several months, and as the embedded software is certified (for aeronautical cases), recertification may be necessary. This method is very costly.

Secondly, this method is not applicable in a structure where one processor managing all sensors of the vehicle is replaced by multiple processors and power generators, all identical, distributed in the transport vehicle, and where each of the multiple processors does not know its position in the vehicle and therefore the length of the cables connecting it to the various apparatus to be supplied with power. Identical current amplitude and voltage amplitude measurements may therefore have completely different meanings concerning the operation and/or identification of the failed relay device, depending on the position of the processor in the transport vehicle. This method does not allow identifying the inoperative device in such a structure.

Finally, the variability of the electronic components of the processor, including the stage generating the signal to be transmitted over the cable and the stage for measuring the amplitude of the voltage and current, needs to be taken into account in the definition of thresholds. For example, the variability in the different gains of the electronic function (induced by the tolerance of the electronic components used) leads to variability in the measurement results obtained for a configuration of a given apparatus to be supplied with power. The margins set aside for the identification of the type of apparatus to be supplied with power are reduced as a result.

Document US 2013/0221973 describes a probe for measuring a fault of a device to be supplied. Document US2013/0278072 describes a system for transferring energy by resonance.

The aim of the present invention is to propose a method for identifying a failed relay device in a power supply system using passive relay devices. This method can be implemented without precise knowledge of the characteristics and length of the cable between the processor and the first relay device.

Advantageously, this identification method is as independent as possible of the variability in the electronic components of the processor.

To this end, an object of the invention is a method for identifying the existence of a failure of a relay device in an electrical power supply system of an apparatus to be supplied with power, said power supply system comprising at least one power generator capable of generating a power signal and a load connected to an output of the power generator, said load comprising at least one relay device; said power generator comprising a variable-frequency drive; said relay device comprising at least one passive quadripole and at least one antenna connected to said at least one passive quadripole; characterized in that said identification method comprises the following steps:

a) selecting a characteristic frequency,
   b) determining the impedance of the load at the output of the power generator when the power signal has the selected characteristic frequency,
   c) repeating steps a) and b) for several characteristic frequencies that are distinct from one another,
   d) identifying the existence of a failure from several impedances determined for different characteristic frequencies.

The invention also relates to a method for identifying a failed relay device in an electrical power supply system of an apparatus to be supplied with power, said power supply system comprising at least one power generator capable of generating a power signal and a load connected to an output of the power generator, said load comprising at least two relay devices; said power generator comprising a variable-frequency drive; each relay device comprising at least one passive quadripole and at least one antenna connected to said at least one passive quadripole; characterized in that said identification method comprises the following steps:

a) selecting a characteristic frequency, b) determining the impedance of the load at the output of the power generator when the power signal has the selected characteristic frequency, c) repeating steps a) and b) for several characteristic frequencies that are distinct from one another, d) identifying the failed relay device from several impedances determined for different characteristic frequencies.

The invention also relates to a method for identifying the type of failure of a relay device in an electrical power supply system of an apparatus to be supplied with power, said power supply system comprising at least one power generator capable of generating a power signal and a load connected to an output of the power generator, said load comprising at least one relay device; said power generator comprising a variable-frequency drive; said relay device comprising at least one passive quadripole and at least one antenna connected to said at least one passive quadripole; characterized in that said identification method comprises the following steps:

a) selecting a characteristic frequency, b) determining the impedance of the load at the output of the power generator when the power signal has the selected characteristic frequency, c) repeating steps a) and b) for several characteristic frequencies that are distinct from one another, d) identifying the type of failure of the relay device from several impedances determined for different characteristic frequencies.

Advantageously, this method exploits the fact that the impedance of the load varies as a function of the frequency in a manner that can be determined according to the type of circuit implemented in each device. This method thus advantageously makes it possible to ignore the variations in impedance related to characteristics of the cable connecting the processor to the first relay device.

According to the invention, in these three methods, the identification step comprises a step of comparing the impedance determined at a given characteristic frequency with at least one threshold, said at least one threshold being specific to said given characteristic frequency.

According to some particular embodiments, these three methods comprise one or more of the following characteristics:

the method further comprises the following steps:

e) calculating the difference between the impedance determined at a given characteristic frequency and the impedance determined at another given characteristic frequency, f) comparing said difference with at least one absolute threshold, said at least one absolute threshold being specific to a pair comprising said given characteristic frequency and said another given characteristic frequency, g) repeating steps e) and f) for several determined impedances.

Advantageously, the determination of the variation in impedance makes it possible to further eliminate the impact of the characteristics and the length of the cable.

the identification step comprises the following steps:

h) calculating the quotient of: the difference between the impedance determined at a given characteristic frequency and the impedance determined at another given characteristic frequency, and an impedance among the impedance determined at the given characteristic frequency and the impedance determined at said another given characteristic frequency, i) comparing the result of calculation step h) with at least one relative threshold, said relative threshold being specific to each pair comprising said given characteristic frequency and said another given characteristic frequency, and j) repeating steps h) and i) for several determined impedances.

Advantageously, this step makes it possible to eliminate the impact of component tolerances in the measurement chain of the processor.

the method further comprises the following steps:

j) assigning the result of each comparison to a category among reference categories, k) comparing the categories assigned in step j) to reference categories.

the power supply system comprises a reference load connected to the output of the power generator in series with the relay devices, said reference load having a known impedance at at least one characteristic frequency, and the step of determining the impedance of the load comprises the following steps:

determining the voltage at the output of the power generator, determining the voltage across the load, calculating the difference between the voltage determined at the output of the power generator and the voltage determined across the load, and determining the impedance of the load from said difference and from the impedance of the reference load.

said characteristic frequencies are determined as a function of at least one element among: the type of circuit of each relay device, the characteristics of the at least one passive quadripole, and the characteristics of the antenna.

The invention also relates to a computer program, characterized in that it comprises instructions for implementing the identification method according to any one of the abovementioned characteristics, when they are executed by a processor.

Finally, the invention relates to a power supply system of an apparatus to be supplied with power, said power supply system comprising:

at least one power generator capable of generating a power signal;

a load comprising at least one relay device, said at least one relay device comprising at least one passive quadripole and at least one antenna connected to said at least one passive quadripole;

characterized in that the power supply system comprises a processor and in that said power generator comprises a variable-frequency drive controlled by said processor; said processor being capable of implementing the identification method according to any one of the abovementioned characteristics.

Alternatively, a reference load having a known impedance at at least one characteristic frequency is connected to the output of the power generator in series with the at least one relay device.

Figure 2:
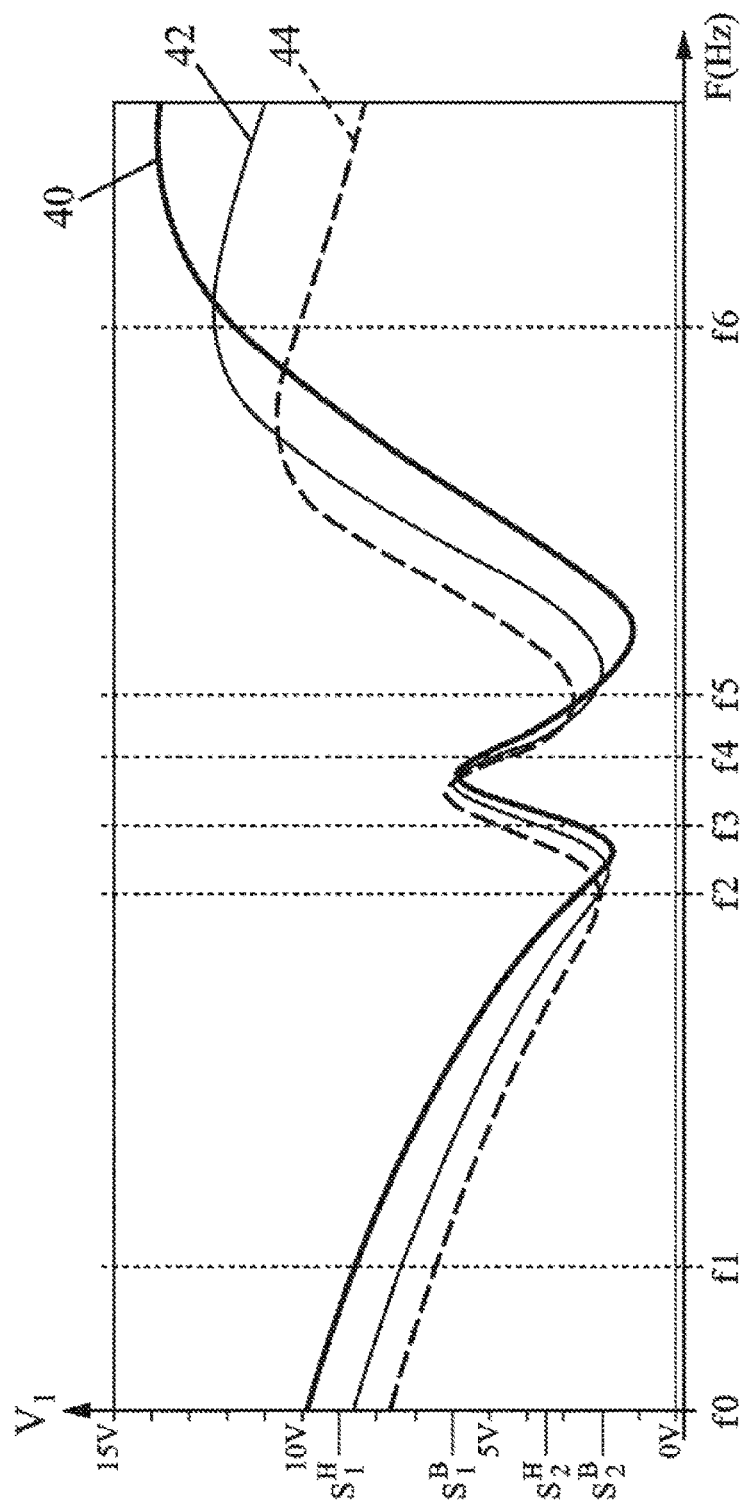
Figure 3:
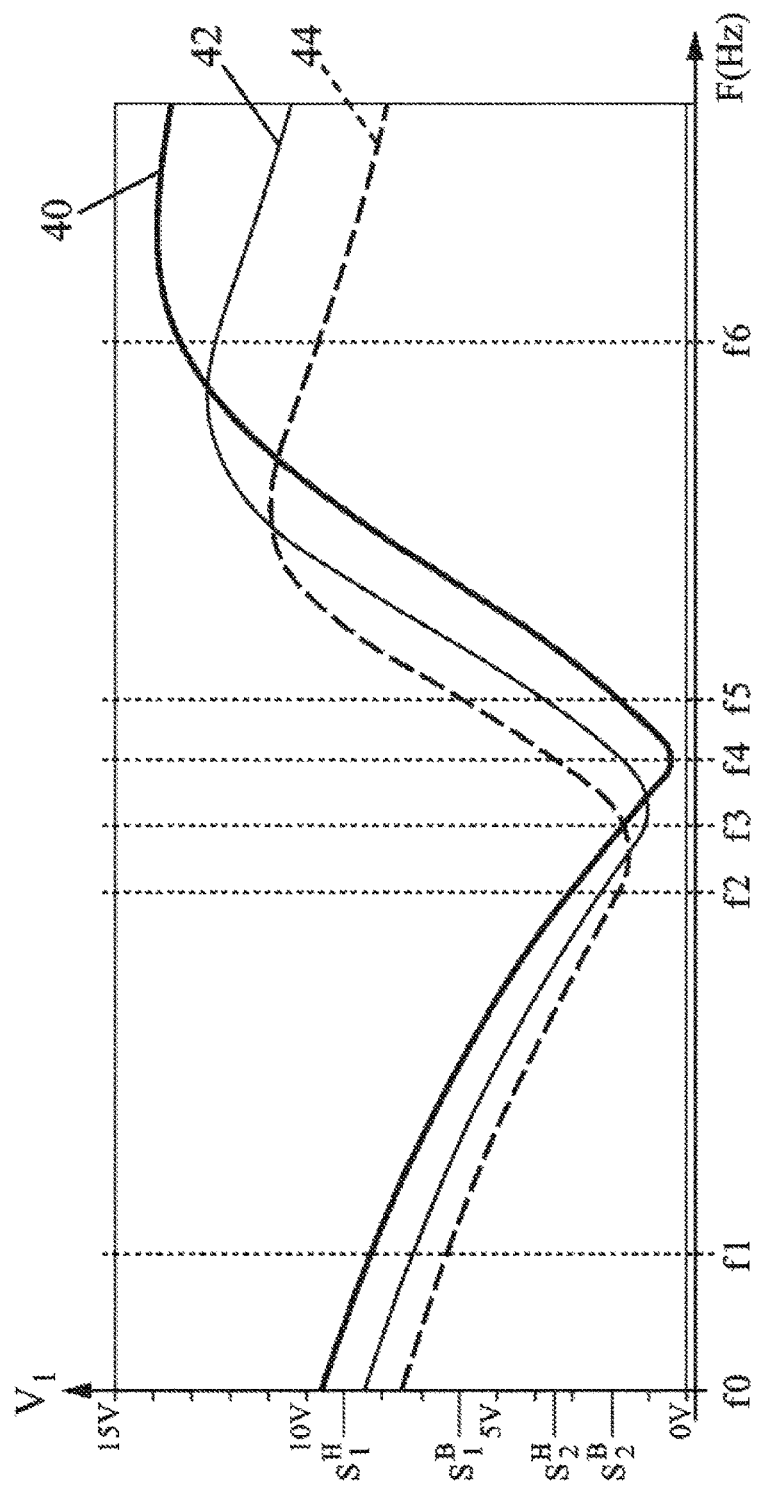
Figure 4:
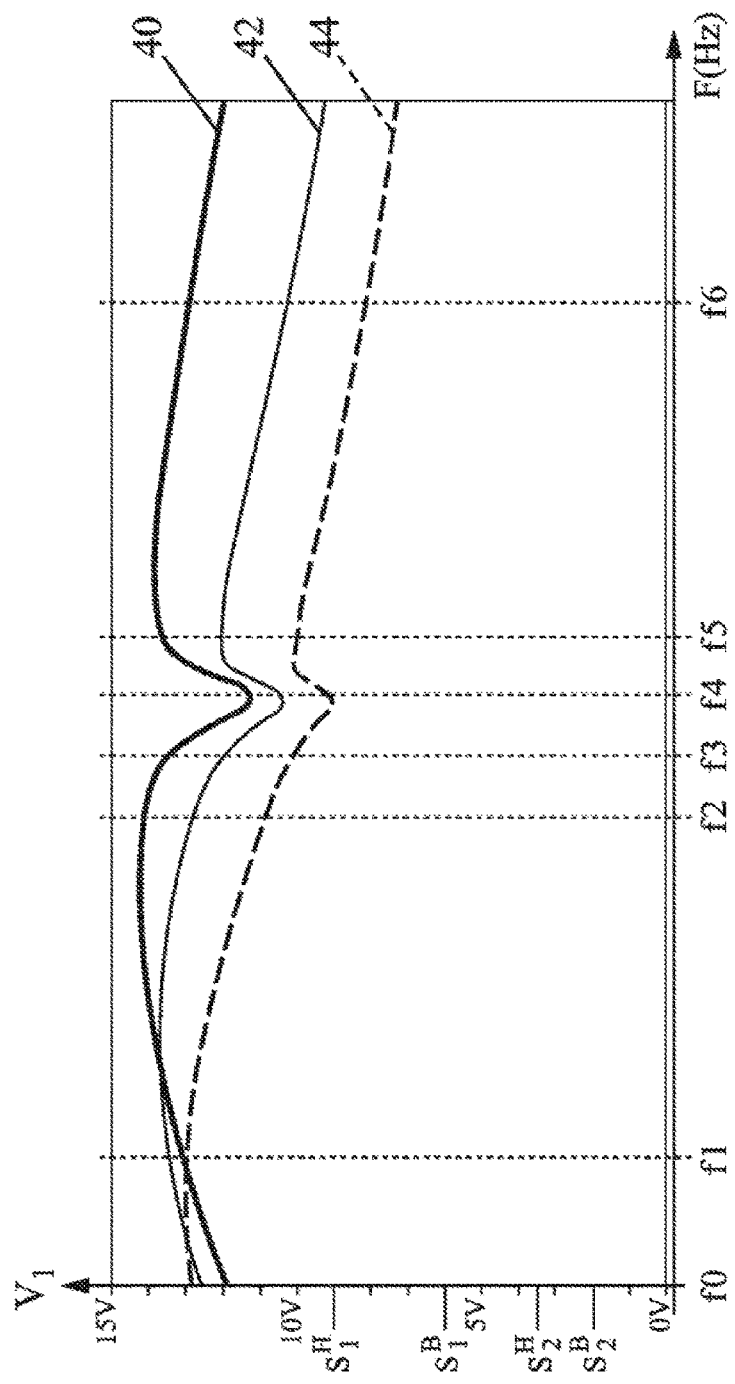
Figure 5:
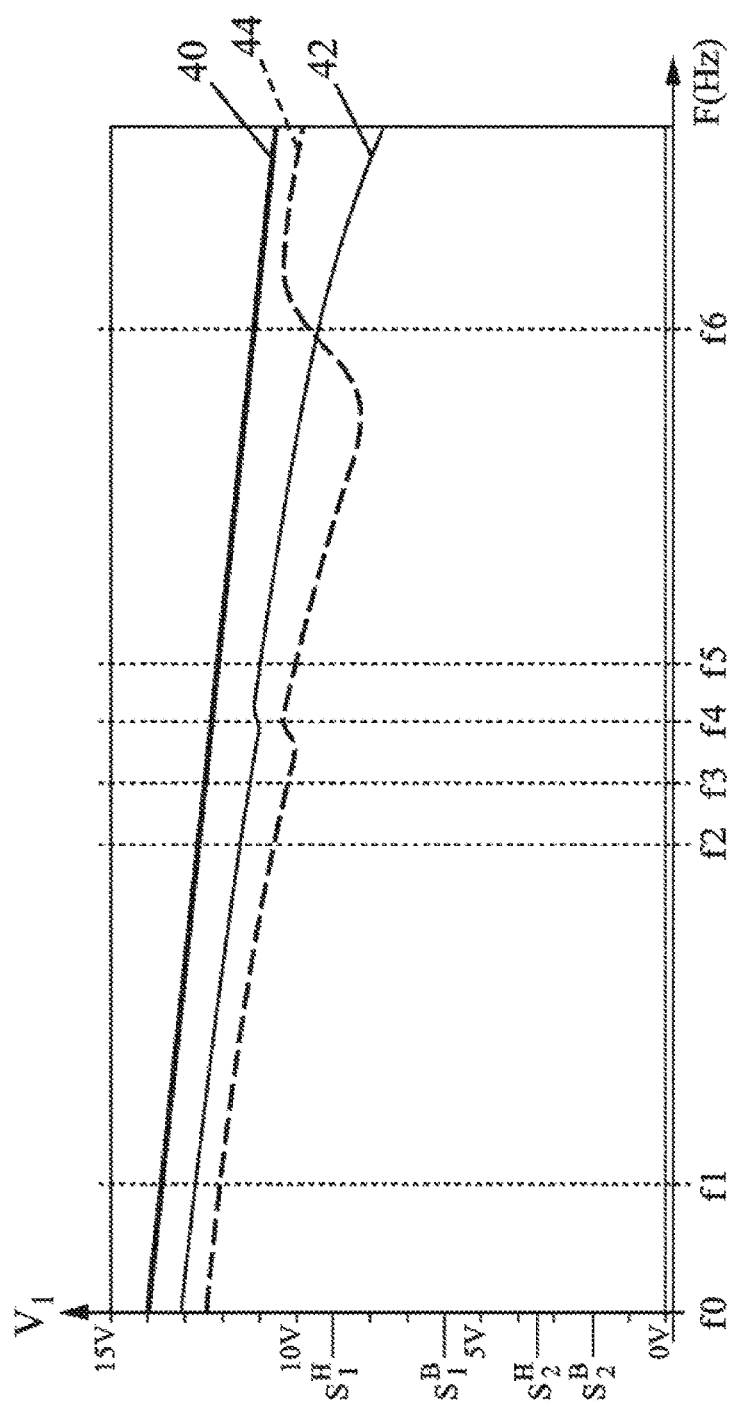
Figure 6:
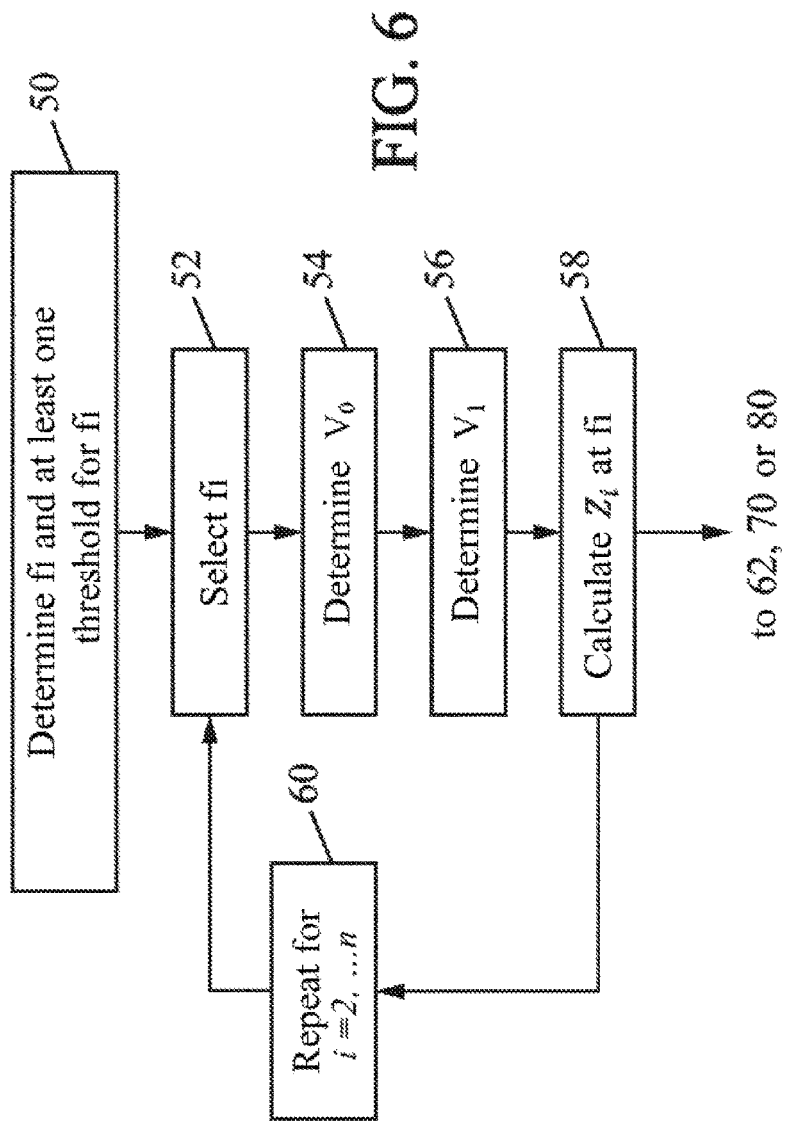
Figure 7:
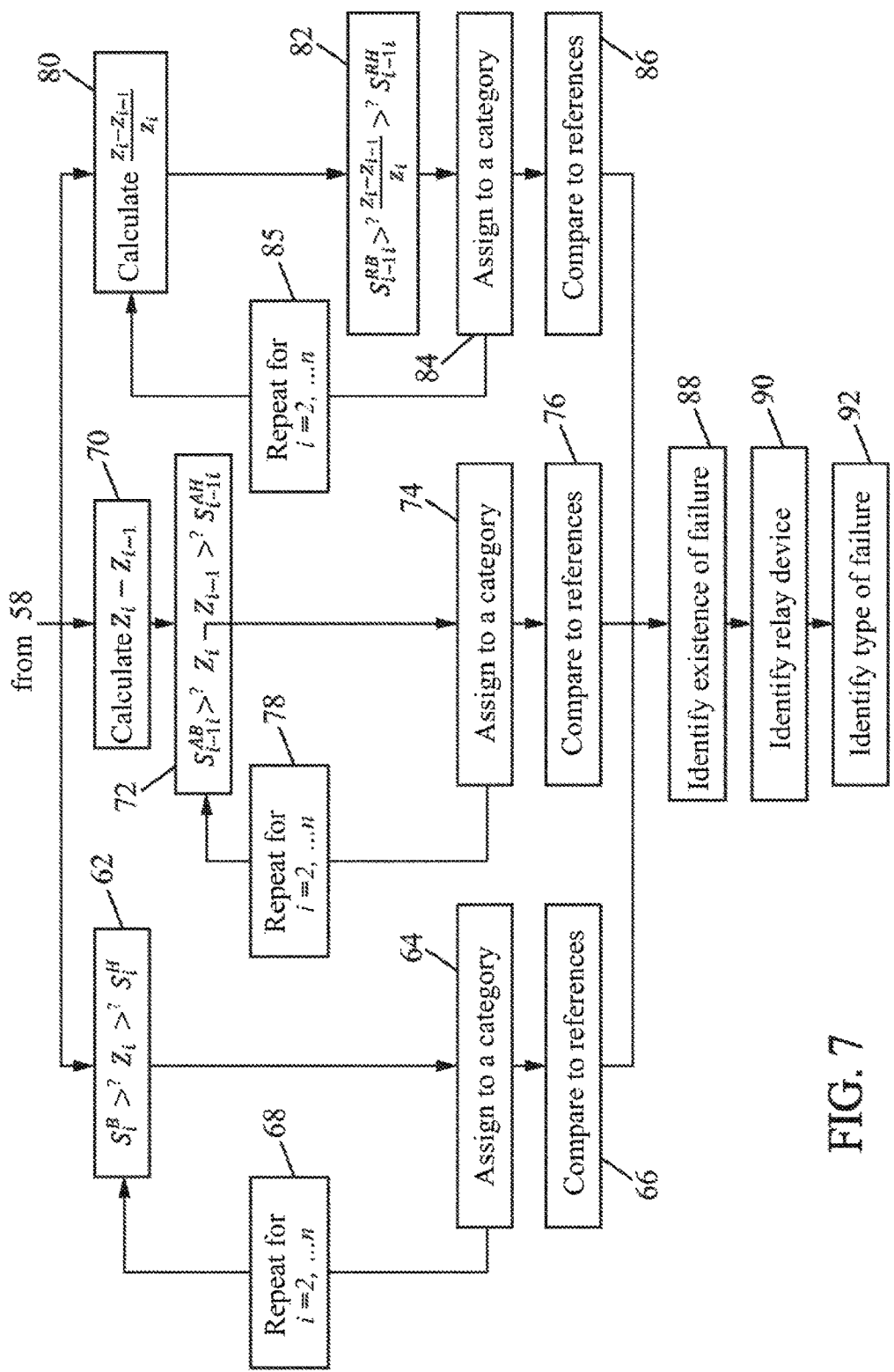

The invention will be better understood by reading the following description, given solely by way of example and provided with reference to the figures in which:

FIG. 1 is a schematic view of a power supply circuit for an apparatus to be supplied with power according to the invention, FIG. 2 is a graph representing examples of variations in the voltage of the load as a function of the frequency in the power supply circuit represented in FIG. 1, when the two relay devices are in an operational state, FIGS. 3 to 5 are graphs similar to the graph represented in FIG. 2 when one or the other of the relay devices presents a typical example of a failure, FIGS. 6 and 7 are diagrams showing the steps of the identification method according to the invention.

The power supply circuit 2 according to the present invention will be described in the context of an exemplary use in which it comprises two relay devices. However, this example is in no way limiting, as the invention can be applied in any power supply system comprising at least one relay device.

With reference to FIG. 1, the power supply circuit 2 according to this exemplary embodiment comprises a power generator 4 suitable for generating a power signal able to supply power to an apparatus 6 to be powered, via a cable 8, of first 10 and second 12 relay devices.

The power supply circuit 2 according to the invention may, for example, be used to power a pressure sensor 6 mounted on a wheel of an aircraft. In this exemplary use, the apparatus to be supplied with power therefore consists of the pressure sensor. The first relay device 10 is fixed to the axle that supports the wheel of the aircraft. It is connected by the cable 8 to the power generator 4. The second relay device 12 is fixed to the wheel perpendicularly to the pressure sensor.

The use of these two relay devices 10, 12 advantageously makes it possible to go from the fixed part, which is the first relay device 10 fixed to the axle, to the movable part, which is the second relay device 12 fixed to the wheel. The use of these two relay devices 10, 12 also enables easy disassembly of the pressure sensor 6 by avoiding a wired connection between the second relay device 12 and the pressure sensor 6.

The power generator 4 comprises a variable-frequency drive 14 which is adapted to vary the frequency of the power signal within a given range around a central frequency. The power signal is a low frequency signal. It has a frequency of 125 kHz for example. It is, for example, able to vary within a range between 75 kHz and 175 kHz. In the embodiment described, the power signal is formed by an amplitude-modulated carrier, the amplitude modulation making it possible to transmit data such as, for example, commands to the pressure sensor 6.

The power supply circuit 2 further comprises a reference load 16 connected to the output of the power generator 4, and a processor 18 able to measure the output voltage $V_0$ of the power generator 4 as well as the voltage $V_1$ of a load 19 connected in series to the reference load 16.

In general, the electric power in an aircraft comes from a central power generator, and the processor 18 has power converters able to convert the voltage and the frequency of the power signal.

In the present description, the term "load 19" denotes the load consisting of the cable 8, the first relay device 10, the second relay device 12, and the pressure sensor 6. Similarly, the term "impedance of the load 19" denotes the impedance of the assembly consisting of the cable 8, the first relay device 10, the second relay device 12, and the pressure sensor 6.

The reference load 16 has a precise impedance. In the embodiment described for the example, the reference load 16 is a resistor.

The processor 18 comprises a memory containing the value of the impedance of the reference load 16. The processor 18 is capable of controlling the frequency converter 14. It is able to demodulate the amplitude of the current transmitted by the pressure sensor 6 in order to receive the pressure measurement information or any information transmitted by the sensor 6. The processor 18 is able to execute the identification methods of the present invention, illustrated in FIGS. 6 and 7 and described hereinafter.

The cable 8 is composed of a first wire 20 and a second wire 22. The reference load 16 is mounted on the first wire between a terminal of the power generator 4 and the first relay device 10. The second wire 22 constitutes the current return path. It is connected to the power generator 4 and to the first relay device 10. The cable 8 comprises inductors and filtering capacitors at the output of the processor (not shown) for filtering electromagnetic interference in accordance with the requirements of electromagnetic compatibility EMC.

The first relay device 10 and the second relay device 12 are relay devices comprising only passive elements (resistors, capacitors, inductors), meaning relay devices which do not have an embedded electrical power supply system.

The first relay device 10, which is mounted on the axle, comprises an antenna 24 and a tuning capacitor 26 connected in a serial arrangement to said antenna 24. This serial connection makes it possible to maximize the current transmitted and thus the magnetic field generated by the antenna 24.

The second relay device 12, which is mounted on the wheel, has a first antenna 28 placed facing the antenna 24 of the first relay device 10, a second antenna 30 placed facing the pressure sensor 6, and a tuning capacitor 32 connected in a parallel arrangement to the first 28 and second 30 antennas. The parallel arrangement of the antennas and the tuning capacitor makes it possible to increase the voltage level of the power supply system by parallel resonance.

The pressure sensor 6, which is fixed to the wheel, comprises an antenna 34 placed facing the second antenna 30 of the second relay device, a tuning capacitor 36 connected in a parallel arrangement to the antenna 34, a processor 38, and elements not represented which allow measuring the tire pressure.

The antenna 34 is able to receive the magnetic field of the power signal and generate a current to power the electronic components of the pressure sensor. The antenna 34 is also able to return the pressure measurement information to the processor 18, for example, by modulation of the load, voltage, or current of its input.

In a manner known per se, processor 38 is capable of demodulating the power signal in order to recover the instructions given by processor 16. Processor 38 controls the components to generate and transmit the pressure measurement information.

Alternatively, the power supply system operates in differential mode. In this case, the power generator 4 is replaced by two generators: a first generator is connected between the first wire 20 and ground, and the second generator is connected between the second wire 22 and ground. The power signal emitted by the second generator has the same frequency and is 180° out of phase with the power signal generated by the first power generator. The impedance of the reference load 16 is then distributed equally in the first wire 20 and the second wire 22. This variant advantageously guards against any external common-mode interference, for example such as ground fluctuations between devices or EM interference.

Alternatively, the power signal may be an average signal or a high frequency signal.

Alternatively, the power signal is not amplitude-modulated. This variant is used when it is not necessary to communicate with the pressure sensor 6 or when communication is carried out by other means of communication.

Alternatively, the pressure sensor 6 is replaced by a temperature, force, deformation sensor or a sensor of an actuator (non-exhaustive list), or by multiple sensors of this type. All of these sensors aim to control and monitor the operation and aging of remote equipment.

More generally,

The signal generated by the power processor 4 may be replaced by a current generator.

The tuning capacitors 26, 32 and 36 are passive quadripoles. They may be replaced by other passive quadripoles based on capacitors, resistors, and/or inductors, or may be replaced by assemblies without capacitors. For example, according to one variant of the invention, the tuning capacitor 32 of the second relay device is replaced by a Pi filter (triangle), or an LC filter, the tuning capacitor 36 of the apparatus to be supplied with power is replaced by a series capacitor or an L filter, and the first relay device 10 does not have a tuning capacitor 26.

The first relay device 10 and the second relay device 12 are replaced by a single relay device.

A connecting cable may replace the second antenna 30 and the antenna 34 of the apparatus to be supplied with power.

The voltage measurements V0 and V1 may be replaced or supplemented by measurements of the output current in the reference load 16.

The principle of the invention is based on the fact that the impedance of the load 19 varies as a function of the frequency in curves characteristic of passive quadripole assemblies. In particular, in the example of the invention illustrated in the figures, the impedance of the load 19 varies as a function of the frequency in curves characteristic of the resonance phenomena of serial or parallel assemblies of circuits comprising an antenna and a tuning capacitor. With reference to FIG. 2, the curves 40, 42, 44 represent variations of the voltage across the load 19 as a function of the frequency of the power signal. These curves 40, 42, 44 have a V shape between frequencies f1 and f6 that is characteristic of serial resonance between the tuning capacitor 26 and the antenna 24, and have a resonance spike between frequencies f2 and f5 that is characteristic of parallel resonance between the first antenna 28, the second antenna 30, and the tuning capacitor 32.

The bold curve 40 represents the variation in voltage of the load 19 when the cable 8 has a length of 1 meter. The thin curve 42 represents the variation in voltage of the load 19 when the cable 8 has a length of 31 meters. Lastly, the dotted curve 44 represents the variation in voltage of the load 19 when the cable 8 has a length of 61 meters.

As can be seen in FIG. 2, the evolution of these curves has very little dependency on the length of the cable 8. It is possible to define periods of increase and decrease between given frequencies. These frequencies are characteristics of the type of connection, parallel or serial, as well as characteristics of the tuning capacitors and characteristics of the antennas. These are referred to hereinafter as characteristic frequencies fi. Determination of the impedance of the load 19 at different characteristic frequencies of the relay device thus makes it possible to carry out an analysis having very little dependency on the characteristics of the connecting cables.

Referring to FIG. 3, the curves 40, 42, 44 represent variations in voltage of the load 19 as a function of the frequency of the power signal, when the antenna 28 of the second relay device is in an open circuit. The resonance spike characteristic of parallel-connection resonance of the second relay device 12 is not visible in this figure. It is therefore possible to deduce that the second relay device 12 has failed.

FIG. 4 represents the same curves of variations in voltage measurements as a function of frequency, when the tuning capacitor 26 is short-circuited. In this case, the V-shape that is characteristic of serial-connection resonance is no longer present.

Finally, FIG. 5 is similar to FIGS. 2 to 4. It shows the variations in voltage of the load 19 as a function of the frequency of the power signal, when a cable wire of the first relay device 10 is disconnected.

The load impedance also varies as a function of the characteristics of the tuning capacitors and the characteristics of the antennas used in each circuit. For example, the central resonance frequency or the width of the pattern are altered when the characteristics of the tuning capacitors and antennas are changed. Due to the tolerance of the selected components or the addition of a tuning procedure between the components, this parameter remains secondary compared to the other variables of the system and in particular the length of the cables and the tolerances of the components used in the power generator 4.

Selecting frequencies characteristic of the nature of the load 19 makes it possible to obtain information that is characteristic of the load 19, particularly of the presence or absence of relay devices 10, 12. Analysis of the impedance values measured at the characteristic frequencies allows identifying the failed relay device.

The identification methods according to the invention will now be described with reference to FIGS. 6 and 7.

During a preliminary analysis step 50, carried out during development of the products, frequencies known as the characteristic frequencies fi are determined by an operator. These characteristic frequencies fi are selected as a function of the evolution of the curve of the variation in the load voltage 19 as a function of frequency, in different situations: when no relay device has failed or in the more typical failure cases such as open circuits or short-circuits in each relay device. Once chosen, these characteristic frequencies are fixed in the processor software 18.

For example, in the embodiment illustrated in FIGS. 2 to 5, characteristic frequencies f1, f2, f3, f4, f5, f6 have been chosen. For each of these characteristic frequencies, one or more thresholds have been determined. These thresholds are different depending on the identification method to be used, as described below. Two thresholds have been used in the example described, but this is not limiting.

During a step 52, the processor 18 controls the frequency converter 14 to select a first characteristic frequency fi, for example characteristic frequency f1.

During a step 54, the processor 18 determines the voltage $V_0$ at the output terminals of the power generator 4, when the frequency of the power signal is characteristic frequency f1.

During a step 56, the processor 18 determines the voltage $V_1$ across the load 19, when the frequency of the power signal is characteristic frequency f1.

During a step 58, the processor 18 calculates the impedance $Z_1$ of the load 19, when the frequency of the power signal is characteristic frequency f1. This impedance $Z_1$ is calculated using Ohm's law and the principle of a divider bridge based on the ratio between voltage $V_0$ and voltage $V_1$ and the value of the impedance of the reference load 16 stored in the processor 18. Since the impedance of the reference load 16 is known and fixed, calculation of the impedance $Z_i$ can be reduced where applicable to a simple calculation of the voltage difference $V_0-V_i$, an amount equivalent to $Z_i$ within a normalization factor, thus exhibiting the same variations in frequency as $Z_i$.

During a step 60, steps 52 to 58 are repeated for all characteristic frequencies fi determined during step 50, for example for characteristic frequencies f2 to f6. Note that the number of frequencies n=6 is arbitrary and may be different from the number described in this example.

The identification method according to the invention then comprises three methods which all enable detecting the existence of a failure, identifying the relay device that has failed, and identifying the type of failure among the most common failures.

The first method is defined by the set of steps 62 to 68. The second method is defined by the set of steps 70 to 78. The third method is defined by the set of steps 80 to 90.

The cases of failure differing most from normal operation can be identified with the first method and the second method. The third method, which tests variations in relative values, makes it possible to refine the analysis to less pronounced variations in impedance between the different cases of failure and normal operation. The advantage of the third method is that it eliminates the impact of manufacturing tolerances for the electronic components used in the power generator 4. They apply once the failure of a relay device can be identified by a relative impedance measurement, which is not always the case. In general, the three methods can be complementary to enable properly conducting a complete analysis of all cases of relay device failure.

We will describe each of these three methods, it being understood that the invention can be implemented using any one of these methods or a combination of any two of these methods or a combination of these three methods.

The first method comprises steps 62 to 68.

During step 62, the impedance $Z_1$ determined for characteristic frequency f1 is compared with at least one threshold. In the example illustrated, the impedance $Z_1$ is compared with a low threshold $S_1^B$ and a high threshold $S_1^H$ which are defined for this characteristic frequency f1. The low threshold $S_1^B$ and high threshold $S_1^H$ define a range for the impedance variation. The low threshold $S_1^H$ and high threshold $S_1^H$ are determined during analysis step 50 by taking into account the evolution of curves 40, 42, and 44 in the operational or non-operational states of each relay device. An example of a low threshold and high threshold defined for characteristic frequencies f1 and f2 has been illustrated in FIG. 2.

During a step 64, the processor 18 assigns the result of the comparison carried out in step 62 to one of the following three categories:

First category: the impedance $Z_1$ is below the low threshold $S_1^B$ and the high threshold $S_1^H$, Second category: the impedance $Z_1$ is above the low threshold $S_1^B$ and below the high threshold $S_1^H$, Third category: the impedance $Z_1$ is above the low threshold $S_1^B$ and the high threshold $S_1^H$.

Steps 62 and 64 are then repeated for all impedances $Z_i$ defined for the characteristic frequencies $f_i$, during a step 68, for example for frequencies f2 to f6.

During a step 66, the processor 18 compares the assigned categories to reference categories contained in a reference table.

Alternatively, at the end of step 64, the processor 18 generates a logic code based on the result of the comparison. Then, during step 66, the processor 18 compares the logic codes generated in the steps 64 for each frequency, to reference categories in a reference table. The processor may possibly concatenate the different logic codes generated in the steps 64 for each frequency.

The second method comprises steps 70 to 78.

During step 70, the processor calculates the difference between two impedances determined during step 58. Preferably, this difference is calculated for impedances determined at successive frequencies. For example, difference $Z_2-Z_1$ is calculated.

During a step 72, this difference $Z_2-Z_i$ is compared with at least one absolute threshold. In this embodiment, this difference is compared with a low absolute threshold $S_{12}^{AB}$ and with a high absolute threshold $S_{12}^{AH}$ which are defined for the pair of characteristic frequencies f1, f2.

During a step 74, the processor 18 assigns the result of the comparison carried out during step 72 to one of the following three categories:

First category: the impedance difference $Z_2-Z_1$ is below the absolute low threshold $S_{12}^{AB}$ and the absolute high threshold $S_{12}^{AH}$, Second category: the impedance difference $Z_2-Z_1$ is above the absolute low threshold $S_{12}^{AB}$ and below the absolute high threshold $S_{12}^{AH}$, Third category: the impedance difference $Z_2-Z_1$ is above the absolute low threshold $S_{12}^{AB}$ and the absolute high threshold $S_{12}^{AH}$.

Steps 70 to 74 are repeated for the impedances $Z_i$ defined for the pairs of characteristic frequencies fi, fi−1, during a step 78.

During a step 76, the processor 18 compares the different categories assigned during step 74 with reference categories in a reference table.

As a variant, at the end of step 74, the processor 18 generates a logic code based on the result of the comparison. Then, during step 76, the processor 18 compares the logic codes generated in the steps 74 for each frequency, to reference categories in a reference table. The processor may possibly concatenate the different logic codes generated in the steps 64 for each frequency.

The third method comprises steps 80 to 86.

Step 80 is similar to step 70 except that the relative value of the differences between impedances is determined. The implementation of this third method makes it possible to eliminate the effect of manufacturing tolerances for the electronic components in the measurement chain and in the chain of the voltage generator of the processor 18. This eliminates the hardware gain from the processor function and makes the tested values more robust to variations in the values from electronic components.

Thus, during step 80, the difference between the two impedances $Z_i-Z_{i-1}$ is divided by impedance $Z_i$ or by impedance $Z_{i-1}$. For example, the quotient is calculated.

In a step 82, the quotient is compared with at least one relative threshold. In the example illustrated, the quotient is compared with a low relative threshold $S_{12}^{RB}$ and a high relative threshold $S_{12}^{RH}$ which are defined for the pair of characteristic frequencies f1, f2.

During a step 84, the processor 18 assigns the result of the comparison made during step 82 to one of the following three categories:

First category: the quotient is below the low relative threshold $S_{12}^{RB}$ and the high relative threshold $S_{12}^{RH}$, Second category: the quotient is above the low relative threshold $S_{12}^{RB}$ and below the high relative threshold $S_{12}^{RH}$, Third category: the quotient is above the low relative threshold $S_{12}^{RB}$ and the high relative threshold $S_{12}^{RH}$.

During a step 85, steps 80 and 82 are repeated for the impedances Zi defined for the pairs of characteristic frequencies fi, fi−1.

During a step 86, the processor 18 compares the categories assigned during the steps 84 with reference categories.

During a step 88, the processor 18 identifies whether a relay device has failed, based on the result of the comparisons carried out in the first method and/or the second method and/or the third method.

During a step 90, the processor 18 identifies the failed relay device, meaning it determines whether it is the first relay device 10 which has failed or if it is the second relay device 12 which has failed, based on the result of the comparisons carried out in the first method and/or the second method and/or the third method.

During a step 92, the processor 18 further identifies the type of failure of the relay device identified during step 72, also from the result of the comparisons carried out in the first method and/or the second method and/or the third method.

Generally, detection of the type of failure requires determining a greater number of characteristic frequencies fi or a more detailed analysis of the results.

The invention may be used to identify the failed relay device or to identify the type of failure without being used to identify the existence of the failure.

The invention could also be used to identify a failure or the type of failure in the apparatus to be supplied with power. In this case, the term "relay device" as used in the present patent application may also include the apparatus to be supplied with power to the extent that the latter comprises an antenna and a tuning capacitor.

The invention claimed is:

1. An identification method for a failure of a relay device in an electrical power supply system of an apparatus to be supplied with power, the power supply system comprising at least one power generator configured to generate a power signal and a load connected to an output of the power generator, the load comprising at least one relay device; the power generator comprising a variable-frequency drive; a processor configured to instruct the variable-frequency drive to generate the power signal at a given frequency; the relay device comprising at least one passive quadripole and at least one antenna connected to the at least one passive quadripole wherein the identification method comprises the following steps:
   a) selecting a characteristic frequency of the power signal by the processor;
   b) generating the power signal by the variable-frequency drive at the characteristic frequency provided by the processor;
   c) measuring values representative of voltages of the power signal before and after a reference load;
   d) based on measuring the voltages, determining an impedance of the load at the output of the power generator at the selected characteristic frequency by the processor;
   e) repeating steps a)-d) for several characteristic frequencies that are distinct from one another; and
   f) identifying the failure from several impedances determined for corresponding different characteristic frequencies;
   the identification step comprising a step of comparing the impedance determined at a given characteristic frequency with at least one threshold, and the at least one threshold being specific to the given characteristic frequency.

2. A method for identifying a failed relay device in an electrical power supply system of an apparatus to be supplied with power, the power supply system comprising at least one power generator configured to generate a power signal and a load connected to an output of the power generator, the load comprising at least two relay devices; the power generator comprising a variable-frequency drive; a processor configured to instruct the variable-frequency drive to generate the power signal at a given frequency; each relay device comprising at least one passive quadripole and at least one antenna connected to the at least one passive quadripole; wherein the method comprises the following steps:
   a) selecting a characteristic frequency of the power signal by the processor;
   b) generating the power signal by the variable-frequency drive at the characteristic frequency provided by the processor;
   c) measuring values representative of voltages of the power signal before and after a reference load;
   d) based on measuring the voltages, determining an impedance of the load at the output of the power generator at the selected characteristic frequency by the processor;
   e) repeating steps a)-d) for several characteristic frequencies that are distinct from one another; and
   f) identifying the failed relay device from several impedances determined for corresponding different characteristic frequencies;
   the identification step comprising a step of comparing the impedance determined at a given characteristic frequency with at least one threshold, and the at least one threshold being specific to the given characteristic frequency.

3. An identification method for a type of failure of a relay device in an electrical power supply system of an apparatus to be supplied with power, the power supply system comprising at least one power generator configured to generate a power signal and a load connected to an output of the power generator, the load comprising at least one relay device; the power generator comprising a variable-frequency drive; a processor configured to instruct the variable-frequency drive to generate the power signal at a given frequency; the relay device comprising at least one passive quadripole and at least one antenna connected to the at least one passive quadripole; wherein the identification method comprises the following steps:
   a) selecting a characteristic frequency of the power signal by the processor;
   b) generating the power signal by the variable-frequency drive at the characteristic frequency provided by the processor;
   c) measuring values representative of voltages of the power signal before and after a reference load;
   d) based on measuring the voltages, determining an impedance of the load at the output of the power generator at the selected characteristic frequency by the processor;
   e) repeating steps a)-d) for several characteristic frequencies that are distinct from one another; and
   f) identifying the type of failure of the relay device from several impedances determined for different characteristic frequencies;
   the identification step comprising a step of comparing the impedance determined at a given characteristic frequency with at least one threshold, the at least one threshold being specific to the given characteristic frequency.

4. The identification method of claim 1, further comprising the following steps:

e) calculating a difference between the impedance determined at a given characteristic frequency and the impedance determined at another given characteristic frequency;

f) comparing the difference with at least one absolute threshold, the at least one absolute threshold being specific to a pair comprising the given characteristic frequency and the another given characteristic frequency; and g) repeating steps e) and f) for several determined impedances.

5. The identification method of claim 1, wherein the identification step further comprises the following steps:

e) calculating a quotient of:
  a difference between the impedance determined at a given characteristic frequency and the impedance determined at another characteristic frequency, and
  one of the impedances among the impedance determined at the given characteristic frequency and the impedance determined at the another given characteristic frequency;

f) comparing a result of calculation step h) with at least one relative threshold, the relative threshold being specific to each pair comprising the given characteristic frequency and the another given characteristic frequency; and g) repeating steps e) and f) for several determined impedances.

6. The identification method of claim 4, further comprising the following steps:

h) assigning the result of each comparison to a category among reference categories; and i) comparing the categories assigned in step h) to reference categories.

7. The identification method of claim 1, wherein the power supply system comprises a reference load connected to the output of the power generator in series with the relay devices, the reference load having a known impedance at at least one characteristic frequency, and wherein the step of determining the impedance of the load comprises the following steps:

determining a voltage at the output of the power generator;

determining the voltage across the load; and calculating a difference between the voltage determined at the output of the power generator and the voltage determined across the load, and determining the impedance of the load from the difference and from the impedance of the reference load.

8. The identification method of claim 1, wherein characteristic frequencies are determined as a function of at least one element among: a type of circuit of each relay device, characteristics of the at least one passive quadripole, and characteristics of the antenna.

9. A computer program comprising instructions on a non-transitory medium for implementing the identification method of claim 1, when the instructions are executed by a processor.

10. An electrical power supply system of an apparatus to be supplied with power, the power supply system comprising:

at least one power generator configured to generate a power signal; and a load comprising at least one relay device, the at least one relay device comprising at least one passive quadripole and at least one antenna connected to the at least one passive quadripole;

and the processor being configured to implement the method of claim 1.

11. The system of claim 10, wherein a reference load having a known impedance is connected to the output of the power generator in series with the at least one relay device.

* * * * *